United States Patent
Ku et al.

(10) Patent No.: US 12,146,476 B2
(45) Date of Patent: Nov. 19, 2024

(54) FLEXIBLE VAPOR CHAMBER WITH SHAPE MEMORY MATERIAL

(71) Applicant: Intel Corporation, Santa Clara, CA (US)

(72) Inventors: Jeff Ku, Taipei (TW); Mark J. Gallina, Hillsboro, OR (US); Min Suet Lim, Penang (MY); Jianfang Zhu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 17/561,605

(22) Filed: Dec. 23, 2021

(65) Prior Publication Data

US 2022/0186716 A1    Jun. 16, 2022

(51) Int. Cl.
*H05K 7/20* (2006.01)
*F03G 7/06* (2006.01)

(52) U.S. Cl.
CPC ....... *F03G 7/0614* (2021.08); *H05K 7/20336* (2013.01); *H05K 7/20318* (2013.01)

(58) Field of Classification Search
CPC .. F28D 15/0233; F28D 15/0241; G06F 1/203; G06F 1/20; G06F 2200/201; H01L 23/427; H05K 1/0203; H05K 1/181; H05K 7/20336
USPC ..................................................... 361/679.52
See application file for complete search history.

(56) References Cited

U.S. PATENT DOCUMENTS

| | | | |
|---|---|---|---|
| 2003/0097839 A1* | 5/2003 | Yazawa | F03G 7/065 60/527 |
| 2007/0280722 A1* | 12/2007 | Katada | B41J 2/175 430/114 |
| 2019/0246488 A1* | 8/2019 | Kuklinski | H05K 1/0203 |
| 2020/0229318 A1* | 7/2020 | Grau | H01L 23/4006 |
| 2020/0355442 A1* | 11/2020 | Lewis | F03G 7/065 |
| 2021/0345524 A1* | 11/2021 | Yebka | H05K 7/20381 |

OTHER PUBLICATIONS

Dahnke, C., et al., "Thermomechanical Behavior of Shape Memory Alloy Metal Matrix Composite Actuator Manufactured by Composite Extrusion," Open Access IOP Publishing, Smart Mater. Struct. 28 (2019) 055022, Apr. 15, 2019; 16 pgs.
Hampton, Terence, "Seminar on Shape Memory," 2016, 44 pages.
Lelieveld, C., "Design and Thermal Testing of Smart Composite Structure for Architecture Applications," Semantic Scholar, Dec. 31, 2013; 5 pages [Abstract Only].
Wikioedia, "Shape-Memory Alloy," Oct. 22,2021; 18 pages.

* cited by examiner

*Primary Examiner* — Mandeep S Buttar
(74) *Attorney, Agent, or Firm* — Banner & Witcoff Ltd.

(57) ABSTRACT

Particular embodiments described herein provide for a flexible vapor chamber with shape memory material for an electronic device. In an example, the electronic device can include a flexible vapor chamber and shape memory material coupled to the shape memory material. When the shape memory material is activated, the shape memory material moves a portion of the flexible vapor chamber to a position that helps with heat dissipation of heat collected by the flexible vapor chamber.

17 Claims, 10 Drawing Sheets

FLEXIBLE VAPOR CHAMBER WITH SHAPE MEMORY MATERIAL

TECHNICAL FIELD

This disclosure relates in general to the field of computing and/or device cooling, and more particularly, to a flexible vapor chamber with shape memory material.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
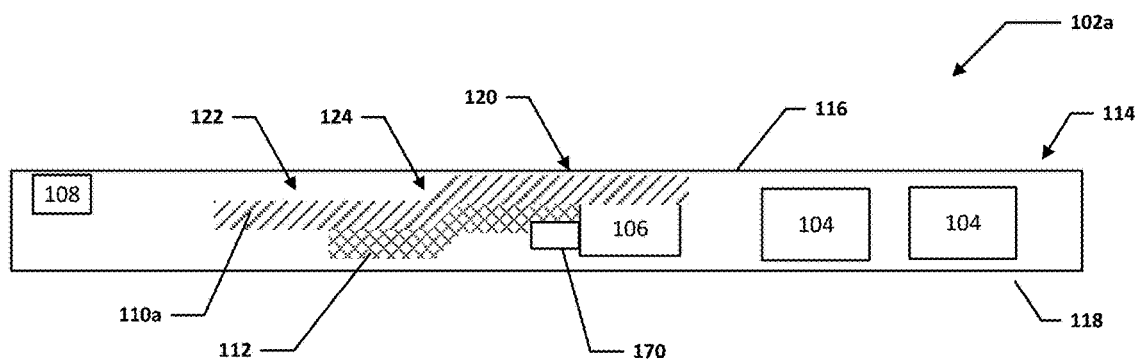
FIGS. 1A-1C are a simplified block diagram of a system to enable a flexible vapor chamber with shape memory material, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a flexible vapor chamber with shape memory material. Features such as structure(s), function(s), and/or characteristic(s), for example, are described with reference to one embodiment as a matter of convenience; various embodiments may be implemented with any suitable one or more of the described features.

In an example, an electronic device can include a heat source and a flexible vapor chamber over the heat source. The shape memory material can be over the flexible vapor chamber and when the shape memory material is activated, the shape memory material moves the flexible vapor chamber to a position that helps with heat dissipation of heat collected by the flexible vapor chamber. In general, as used herein, the terms "dissipated," "conducted," and "transferred," (and their derivatives) mean the same thing and, in the text of heat or thermal energy, mean the heat or thermal energy is moved, dissipated, conducted, transferred, etc. from one element to another element (e.g., from a heat source to a vapor chamber, from a vapor chamber to a chassis or heat exchanger, from a chassis to a cooling dock, etc.)

In an example, when a cover (e.g., protective cover, docking station, keyboard attachment, etc.) is attached to the electronic device, the shape memory material can be activated and the flexible vapor chamber can move to a location that is on or approximately on the chassis of the electronic device to help dissipate heat collected by the flexible vapor chamber to the chassis of the electronic device (through conduction if directly on and through convection if approximately on). When the cover is not attached to the electronic device, the shape memory material can be deactivated and the flexible vapor chamber can move to a location that is not on or approximately on the chassis of the electronic device to help keep the chassis from becoming too hot and potentially harmful to a user. The term "on or approximately on the chassis" includes being on the chassis and a distance from the chassis where heat from the flexible vapor chamber can be relatively easily transferred to the chassis as compared to a distance from the chassis where an air gap is created or present and heat from the flexible vapor chamber cannot be relatively easily transferred to the chassis. The term "approximately on the chassis" includes being a distance of 3.5 millimeters or less from the chassis and ranges therein (e.g., 2.5 millimeters or less from the chassis, 1 millimeter or less from the chassis, 0.8 millimeters or less from the chassis, etc.), depending on design choice and design constrains.

In another example, the flexible vapor chamber can include a main body and one or more extensions that extend from the main body. One or more of the extensions can include the shape memory material and/or one or more heat exchangers. When the shape memory material is activated, the flexible vapor chamber can move one or more of the extensions to a location that is out of plane with the other extensions to help increase airflow through the heat exchangers and help dissipate heat collected by the flexible vapor chamber.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed on, over, or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Furthermore, the term "connected" may be used to describe a direct connection between the things that are connected, without any intermediary devices, while the term "coupled" may be used to describe either a direct connection between the things that are connected, or an indirect connection through one or more intermediary devices. The terms "substantially," "close," "approximately," "near," and "about," generally refer to being within +/−15% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Turning to FIG. 1A, FIG. 1A is a simplified diagram of an electronic device 102a configured with a flexible vapor chamber with shape memory material, in accordance with an embodiment of the present disclosure. In an example, the electronic device 102a can include one or more electronic components 104, one or more heat sources 106, a proximity sensor 108, a flexible vapor chamber 110a, shape memory material 112, a chassis 114, and a shape memory material activator 170. The chassis 114 can include a first side 116 and a second side 118. The flexible vapor chamber 110a can include a static portion 120, a variable portion 122, and a bend portion 124. In an example, when the proximity sensor 108 does not detect a cover or covering over the first side 116 of the chassis 114, the shape memory material 112 is not activated and the variable portion 122 of the flexible vapor chamber 110a is positioned away from the first side 116 of the chassis 114. By positioning the flexible vapor chamber 110a away from the first side 116 of the chassis 114, the first side 116 of the chassis 114 can maintain a temperature inside safety limits in the event a user touches the first side 116 of the chassis 114. In some examples, the flexible vapor chamber 110a is a flexible heat pipe, flexible cold plate, flexible heat spreader (graphic heat spreader, etc.) or some other flexible thermo conductive material or element.

Figure 1B:
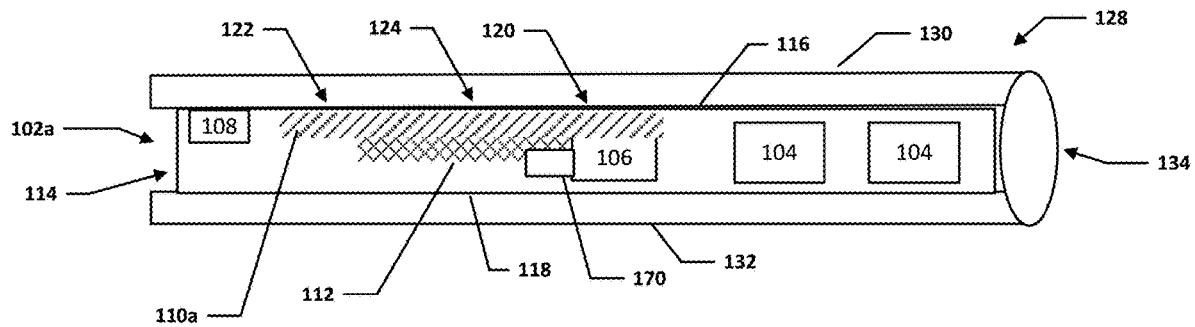
Figure 1C:
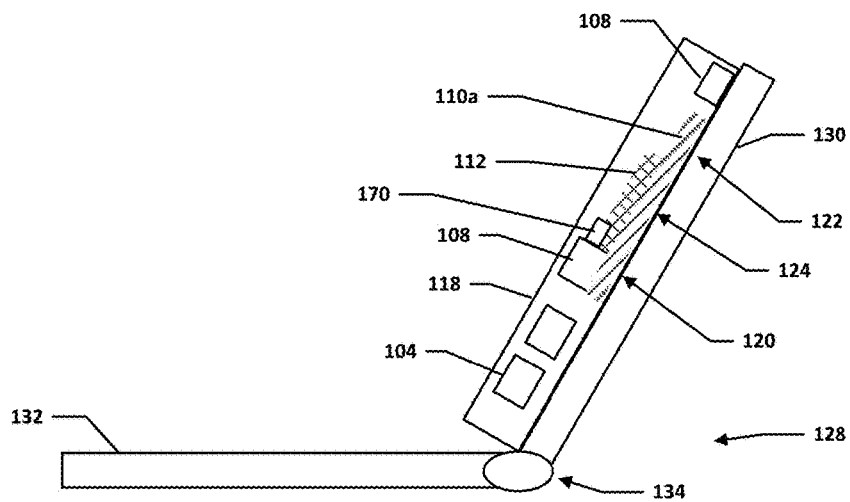

Turning to FIGS. 1B and 1C, FIGS. 1B and 1C are a simplified diagram of the electronic device 102a configured with the flexible vapor chamber with shape memory material, in accordance with an embodiment of the present disclosure. In an example, the electronic device 102a can include the one or more electronic components 104, the one or more heat sources 106, the proximity sensor 108, the flexible vapor chamber 110a, the shape memory material 112, and the chassis 114. The chassis 114 can include the first side 116 and the second side 118. The flexible vapor chamber 110a can include the static portion 120, the variable portion 122, and the bend portion 124. In an example, when the proximity sensor 108 detects a cover or covering is over the first side 116 of the chassis 114, the shape memory material 112 can be activated and the variable portion 122 of the flexible vapor chamber 110a is positioned on or approximately on the first side 116 of the chassis 114 such that heat from the flexible vapor chamber 110a can be transferred to the first side 116 of the chassis 114. In some examples, the proximity sensor 108 sends a signal to the shape memory material activator 170 to activate the shape memory material 112.

In an example, the covering may be a protective cover 128. In other examples, the covering may be a different type of covering (e.g., a keyboard case, cooling docking station, charging dock, etc.). The protective cover 128 can include a first cover side 130 and a second cover side 132. The first cover side 130 can be rotationally or pivotably coupled to the second cover side 132 using a hinge 134. In an example, the first cover side 130 can be configured to help dissipate heat collected by the flexible vapor chamber 110a that has been conducted to the first side 116 of the chassis 114. In an example, the hinge 134 is a mechanical hinge. In another example, the hinge 134 includes the same material as the first cover side 130 and the second cover side 132 and is a transition area of the protective cover 128 that allows the first cover side 130 to be over the first side 116 of the chassis 114 and the second cover side 132 to be over the second side 118 of the chassis 114.

Each of the electronic components 104 can be a device or group of devices available to assist in the operation or function of the electronic device 102a. Each of one or more heat sources 106 may be a heat generating device (e.g., processor, logic unit, field programmable gate array (FPGA), chip set, a graphics processor, graphics card, battery, memory, or some other type of heat generating device). The proximity sensor 108 can be a capacitance-based proximity sensor, hall sensor, an infrared sensor, or some other sensor, device, or system that can detect when a cover or covering is over the first side 116 of the chassis 114.

The flexible vapor chamber 110a can be a thermal ground plane or some other type of flexible vapor chamber. In some examples, the flexible vapor chamber 110a is a flexible heat pipe, flexible cold plate, flexible heat spreader (graphic heat spreader, etc.) or some other flexible thermo conductive material or element. The shape memory material 112 is a material that can deform when cold or cooled and return to a pre-deformed shape when heated. In some examples, the shape memory material 112 is a shape memory alloy (SMA), memory metal, memory alloy, smart metal, smart alloy, or muscle wire, or some other shape memory material. One type of shape memory material is a nickel-titanium alloy ("Nitinol"). The shape memory material 112 can be used to move the flexible vapor chamber 110a towards and away from the first side 116 of the chassis 114 using of the shape memory effect (SME) or shape memory "temperatures" that are selected for the shape memory material 112. The SME occurs at an "$A_F$" temperature, which is controlled via small changes in material composition. The $A_F$ can be set anywhere from about −20° C. to 110° C., with a tolerance of ±1° C. In an example, a current through the shape memory material 112, that is activated by the shape memory material activator 170, can activate the shape memory material 116.

In an example, when the proximity sensor 108 does not detect a cover or covering (e.g., the protective cover 128) coupled to the electronic device 102a, the shape memory material 112 is not activated and the variable portion 122 of the flexible vapor chamber 110a is positioned away from the first side 116 of the chassis 114. This keeps the variable portion 122 of the flexible vapor chamber 110a away from the first side 116 of the chassis 114 and helps keep the skin temperature of the chassis 114 relatively cool and safe for a user to touch the first side 116 of the chassis 114. When the proximity sensor 108 detects a cover or covering is over the first side 116 of the chassis 114, the proximity sensor 108 can send a signal to the shape memory material activator 170 to activate the shape memory material 112. The activation of the shape memory material 112 can move the variable portion 122 of the flexible vapor chamber 110a to a position on or approximately on the first side 116 of the chassis 114. This allows heat from the variable portion 122 of the flexible vapor chamber 110a to be transferred to the first side 116 of the chassis 114 to help cool the flexible vapor chamber 110a. In some examples, the covering can have an active heat spreader that helps to draw heat from the flexible vapor chamber 110a. In other examples, the covering can have a passive heat spreader (e.g., a cold plate) that helps to draw heat from the flexible vapor chamber 110a. When the covering is removed from the first side 116 of the chassis, the shape memory material 112 can be de-activated and the variable portion 122 of the flexible vapor chamber 110a can be returned to being positioned away from the first side 116 of the chassis 114 to help keep the skin temperature of the chassis 114 relatively cool and safe for a user to touch the first side 116 of the chassis 114.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source. One way to cool a heat source is to use a heat pipe or vapor chamber.

Heat pipes and vapor chambers are heat-transfer devices that combine the principles of both thermal conductivity and phase transition to transfer heat between two interfaces (e.g., a heat source and a cold or cool interface such as a heatsink). At the hot interface of a heat pipe or vapor chamber (e.g., the portion of the heat pipe or vapor chamber near the heat source), a liquid in contact with a thermally conductive solid surface near the heat source turns into a vapor by absorbing heat from the heat source. The vapor then travels along the heat pipe or through the vapor chamber to the cold or cool interface and condenses back into a liquid, releasing the collected heat. The liquid then returns to the hot interface through either capillary action, centrifugal force, or gravity and the cycle repeats.

A typical heat pipe or vapor chamber consists of a sealed pipe or tube made of a material that is compatible with a working fluid (e.g., copper for water heat pipes or aluminum for ammonia heat pipes). During construction of the heat pipe or vapor chamber, a vacuum pump is typically used to remove the air from an empty heat pipe or vapor chamber. The heat pipe or vapor chamber is partially filled with the working fluid and then sealed. The working fluid mass is chosen such that the heat pipe or vapor chamber contains both vapor and liquid over a desired operating temperature range. Below the operating temperature, the liquid is cold and cannot vaporize into a gas. Above the operating temperature, all the liquid has turned to gas, and the environmental temperature is too high for any of the gas to condense. Thermal conduction is still possible through the walls of the heat pipe or vapor chamber but at a greatly reduced rate of thermal transfer.

Working fluids are chosen according to the temperatures at which the heat pipe or vapor chamber will operate. For example, at extremely low temperature applications, (e.g., about 2-4 K) liquid helium may be used as the working fluid and for extremely high temperatures, mercury (e.g., about 523-923 K), sodium (e.g., about 873-1473 K), or indium (e.g., about 2000-3000 K) may be used as the working fluid. The vast majority of heat pipes or vapor chambers for room temperature applications use water (e.g., about 298-573 K), ammonia (e.g., about 213-373 K), or alcohol (e.g., methanol (e.g., about 283-403 K) or ethanol (e.g., about 273-403 K)) as the fluid. Copper/water heat pipes or vapor chambers have a copper envelope, use water as the working fluid and typically operate in the temperature range of about twenty degrees Celsius (20° C.) to about one-hundred and fifty degrees Celsius (150° C.). Water heat pipes or vapor chambers are sometimes filled by partially filling the heat pipe or vapor chamber with water, heating until the water boils and displaces the air, and then sealing the heat pipe or vapor chamber while hot.

Some systems use a cooling pad to try and help provide additional cooling for the electronic device. However, cooling pads typically only cool the bottom surface of the electronic device. Because there are typically not any thermal vents on the bottom surface of the electronic device where the cooling pad is in contact with the electronic device, the internal components of the electronic device are not cooled as directly as they are with a heat pipe.

Another common solution to address the thermal challenges of devices and systems is to use a fan and a heat sink. However, the volume of some current thermal solutions composed of fan, heat sinks, and heat pipe/vapor chamber is insufficient due to a need to bring the total thickness of electronic devices, especially high-performance computing mobile devices, lower and reduce the Z-height of the electronic devices. One of the biggest issues when system thickness is reduced is mainly due to a lack of space for thermal solutions. Typically, the fins on a heat sink are made of copper or aluminum, mounted perpendicularly to a heat pipe or vapor chamber. This design is rigid and, due to the need for a relatively low Z-height, the volume of the flow of air to the fins cannot be increased to increase cooling capacity. Some systems use a larger fan or thicker thermal solution design to provide increased heat dissipation. However, a larger fan can reduce the battery life and both a larger fan and thicker thermal solution can increase the thickness of the system. Heat pipes and vapor chambers are ubiquitous in current mobile thermal solutions however, current vapor chambers and heat sinks are typically static and do not move. What is needed is a means, system, apparatus, method, etc. of allowing a vapor chamber to move to a position that can help increase the cooling capacity of an electronic device.

A system to enable a flexible vapor chamber with shape memory material, as outlined in FIG. 1, can resolve these issues (and others). In an example, when the shape memory material is activated, the shape memory material can move at least a portion of the flexible vapor chamber to a position that can help increase the cooling capacity of an electronic device. The flexible vapor chamber with shape memory material can include a flexible vapor chamber (e.g., the flexible vapor chamber 110a) and shape memory material (e.g., the shape memory material 112). In an example, the flexible vapor chamber can be made out of or include a SMA. In other examples, SMA can be attached to the surface of the flexible vapor chamber. The SMA is an alloy that can be deformed when cold but returns to its pre-deformed shape when heated. The SMA may also be called memory metal, memory alloy, smart metal, smart alloy, or muscle wire.

In an example, to help increase the system cooling capability, the electronic device can use the flexible vapor chamber with shape memory material and a cooling dock or accessory to help the system to gain the extra cooling benefit from a dock or accessory without incurring the impact that comes from adding ventilation or cooling ingress holes. More specifically, in one example implementation, when the electronic device is attached to a cooling dock or accessory, the shape memory material can be activated to move the flexible vapor chamber closer to the cooling dock or accessory so heat collected by the flexible vapor chamber can be conducted or transferred to the cooling dock or vapor chamber. In another example, the flexible vapor chamber with shape memory material can be also used with actively cooled systems with the benefit of an added amount of heat exchanger fins without increasing flow resistance.

In a specific example, in the passive cooled system, in a detached or tablet mode, the flexible vapor chamber with shape memory material is located near an electronic component (e.g., a battery) to help reserve a gap between the chassis of the electronic device and the flexible vapor chamber for a relatively cooler skin chassis temperature. When the chassis is covered, a proximity sensor (e.g., the proximity sensor 108) senses the attachment of the chassis cover and sends a signal to a shape memory activator (e.g., the shape memory activator 170) to activate the shape memory material. The shape memory material moves the flexible vapor chamber to a location near the chassis or on the chassis. This allows at least a portion of the heat in the flexible vapor chamber to be transferred to the chassis. From the chassis, the heat can be transferred to the cover to help cool the electronic device. In an example, a fan in the cover can help cool the chassis and vapor chamber with air blown from the fan.

In another specific example, in an actively cooled system, the vapor chamber is designed to include wing designs or extensions with shape memory material attached to one or more of the wings or extensions. In a system OFF/low workload mode/lower temperature condition, all the vapor chamber wing sections or extensions are coplanar. When the system is in a ON/high workload/high temperature condition, the shape memory material is activated and shift the one or more wings or extensions that include the shape memory material stipes to move up (or down) and stagger the heat exchangers for a lower air flow resistance path to increase the cooling capability of the electronic device. In some examples, the electronic device can include an expandable heatsink and/or fan to further help increase the airflow. The expandable heatsink and/or fan can help to further increase the cooling capability of the electronic device, especially thin high-powered laptops when increased cooling is needed without increasing system Z-height when increased cooling is not needed. The term "Z-height," "Z location," etc. refers to the height along the "Z" axis of an (x, y, z) coordinate axis or cartesian coordinate system.

The shape memory material on the flexible vapor chamber can be electrically connected to the shape memory material activator. The shape memory material can be activated by the shape memory material activator when appropriate conditions are met (e.g., the proximity sensor senses the cover is attached to the back cover, increased cooling is needed, during high CPU workload conditions, a heat source or other component reach a temperature threshold (e.g., a maximum operating temperature of a CPU or other component or a percentage (e.g., 80%) of a maximum operating temperature of a CPU or other component), etc.). The shape memory material is attached to the flexible vapor chamber and can be used to provide actuation to help position the flexible vapor chamber to provide additional cooling. The shape memory material can be also activated through a temperature sensing mechanism or through an embedded controller that's used for the other aspects of system hardware management. In some examples, the shape memory material is activated by heat from the heat source.

Figure 2:
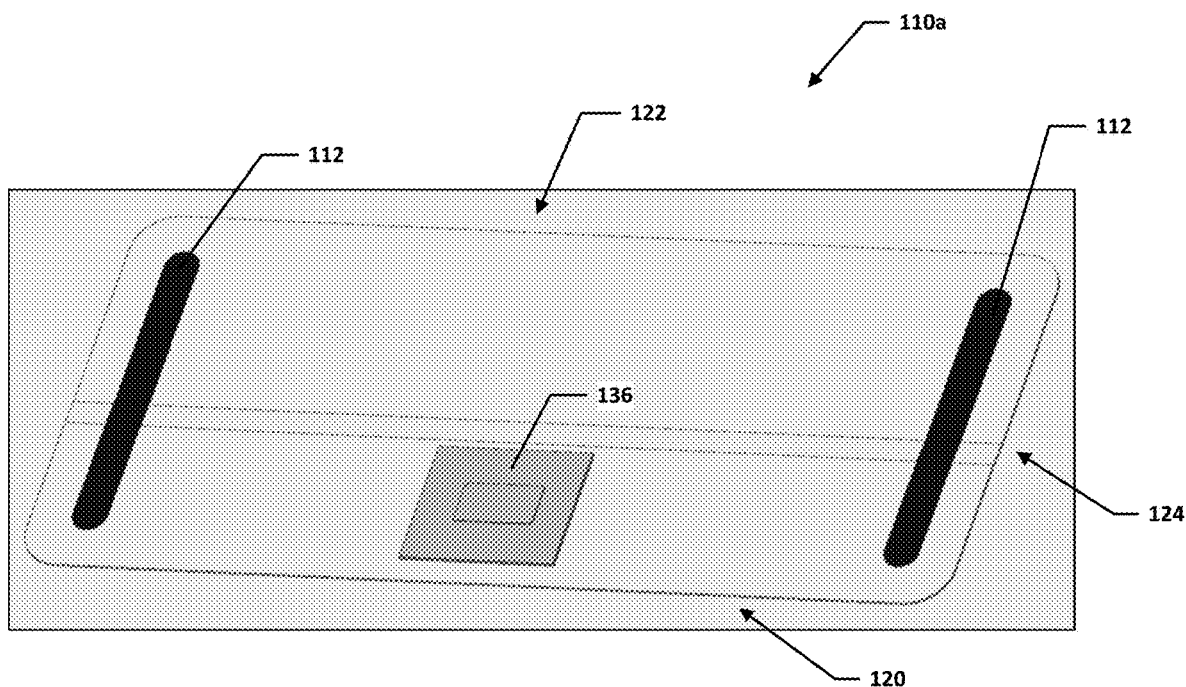
FIG. 2 is a simplified diagram of a partial perspective view of a system to enable a flexible vapor chamber with shape memory material, in accordance with an embodiment of the present disclosure.

Turning to FIG. 2, FIG. 2 is a simple block diagram illustrating example details of a portion of a flexible vapor chamber with shape memory material, in accordance with an embodiment of the present disclosure. In an example, the flexible vapor chamber 110a can include the static portion 120, the variable portion 122, the bend portion 124, and a heat source interface 136. In an example, one or more strips of the shape memory material 112 can be on the flexible vapor chamber 110a such that when the shape memory material 112 is activated, the shape memory material 112 bends or moves at least a portion of the flexible vapor chamber 110a.

The heat source interface 136 can be configured to couple with a heat source (e.g., heat source 106) and help transfer heat from the heat source to the flexible vapor chamber 110a. The static portion 120 of the flexible vapor chamber 110a is the portion of the flexible vapor chamber 110a that is over the heat source and does not move. The variable portion 122 of the flexible vapor chamber 110a is the portion of the flexible vapor chamber 110a that is away from the chassis of the electronic device that includes the flexible vapor chamber 110a when the shape memory material 112 is not activated and is on or approximately on the chassis of the electronic device that includes the flexible vapor chamber 110a when the shape memory material 112 is activated. The bend portion 124 of the flexible vapor chamber 110a helps to allow the shape memory material 112 to bend or move the variable portion 122 of the flexible vapor chamber 110a and can help accommodate the compression and stretching forces as the flexible vapor chamber 110a is moved or bent by the shape memory material 112.

Figure 3A:
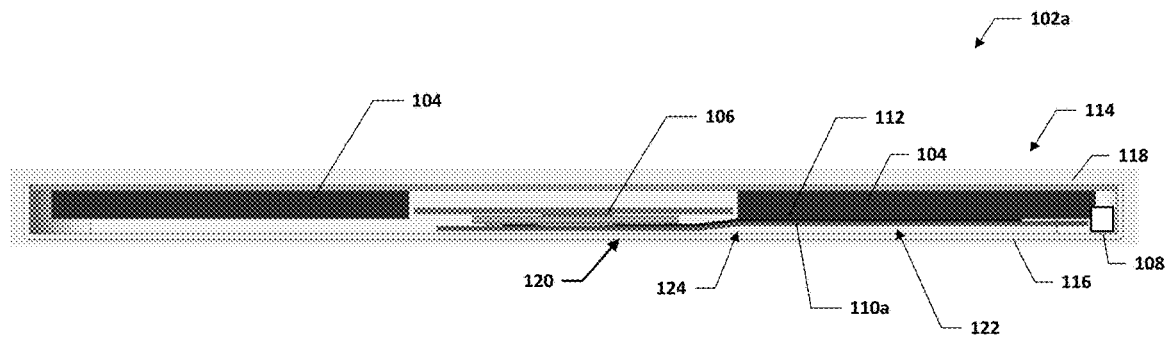
FIGS. 3A and 3B are a simplified diagram of a partial cut away side view of a system to enable a flexible vapor chamber with shape memory material, in accordance with an embodiment of the present disclosure.

Turning to FIG. 3A, FIG. 3A is a simplified diagram of the electronic device 102a configured with a flexible vapor chamber with shape memory material, in accordance with an embodiment of the present disclosure. In an example, the electronic device 102a can include the one or more electronic components 104, one or more heat sources 106, the proximity sensor 108, the flexible vapor chamber 110a, the shape memory material 112, and the chassis 114. In an example, the proximity sensor 108 functions as the shape memory material activator 170. The chassis 114 can include the first side 116 and the second side 118. The flexible vapor chamber 110a can include the static portion 120, the variable portion 122, and the bend portion 124. In an example, when the proximity sensor 108 does not detect a cover or covering is over the first side 116 of the chassis 114, the shape memory material 112 is not activated and the variable portion 122 of the flexible vapor chamber 110a is positioned away from the first side 116 of the chassis 114.

Figure 3B:
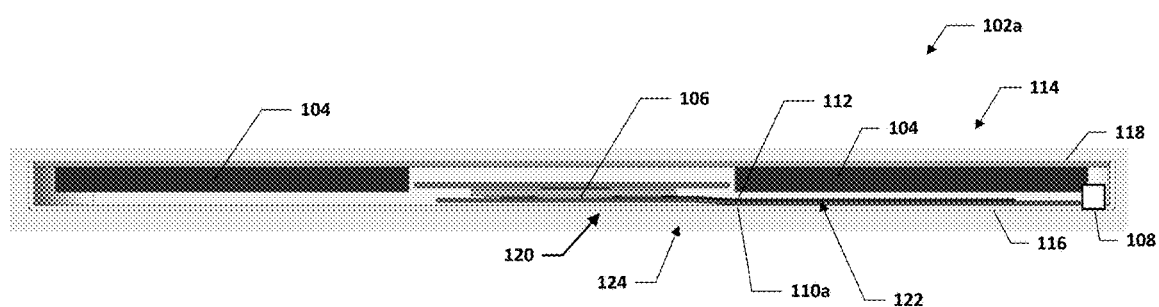

Turning to FIG. 3B, FIG. 3B is a simplified diagram of the electronic device 102a configured with a flexible vapor chamber with shape memory material, in accordance with an embodiment of the present disclosure. In an example, the electronic device 102a can include the one or more electronic components 104, the one or more heat sources 106, the proximity sensor 108, the flexible vapor chamber 110a, the shape memory material 112, and the chassis 114. In an example, the proximity sensor 108 functions as the shape memory material activator 170. The chassis 114 can include the first side 116 and the second side 118. The flexible vapor chamber 110a can include the static portion 120, the variable portion 122, and the bend portion 124. In an example, when the proximity sensor 108 detects a cover or covering (not shown) is over the first side 116 of the chassis 114, the shape memory material 112 is activated and moves or bends the variable portion 122 of the flexible vapor chamber 110a to a position where the flexible vapor chamber 110a is on or approximately on the first side 116 of the chassis 114.

Figure 4:
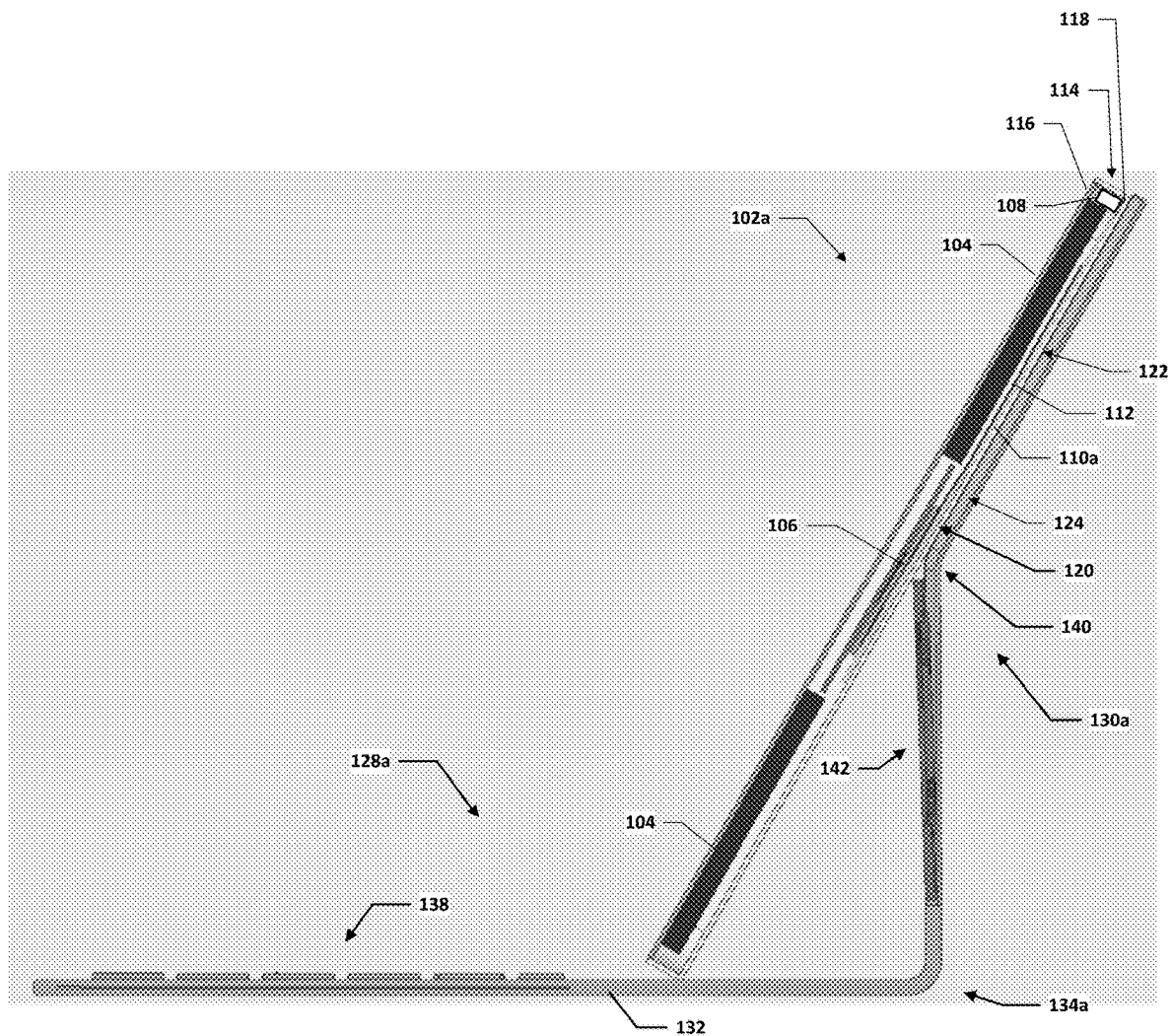
FIG. 4 are a simplified diagram of a partial cut away side view of a system to enable a flexible vapor chamber with shape memory material, in accordance with an embodiment of the present disclosure.

Turning to FIG. 4, FIG. 4 is a simplified diagram of the electronic device 102a configured with a flexible vapor chamber with shape memory material, in accordance with an embodiment of the present disclosure. In an example, the electronic device 102a can include the one or more electronic components 104, the one or more heat sources 106, the proximity sensor 108, the flexible vapor chamber 110a, the shape memory material 112, and the chassis 114. The chassis 114 can include the first side 116 and the second side 118. The flexible vapor chamber 110a can include the static portion 120, the variable portion 122, and the bend portion 124. In an example, when the proximity sensor 108 detects a cover or covering is over the first side 116 of the chassis 114, the shape memory material 112 is activated and the variable portion 122 of the flexible vapor chamber 110a is positioned on or approximately on the first side 116 of the chassis 114.

In an example, the covering may be a protective case 128a. The protective case 128a can include a first cover side 130a and a second cover side 132a. The first cover side 130a can be rotationally or pivotably coupled to the second cover side 132a using a hinge 134a. In an example, the first cover side 130a can be configured to help dissipate heat collected by the flexible vapor chamber 110a. In an example, the hinge 134a is a mechanical hinge. In another example, the hinge 134a includes the same material as the first cover side 130a and the second cover side 132a and is a transition area of the protective case 128a that allows the first cover side 130a to be over the first side 116 of the chassis 114 and the second cover side 132a to be over the second side 118 of the chassis 114.

The first cover side 130a of the protective case 128a can include an electronic device adjustment portion 140 and a fan 142. The electronic device adjustment portion 140 of the first cover side 130a can be used by a user to adjust a viewing angle of the electronic device 102a, especially if the electronic device 102a includes a display. The fan 142 can help force air towards the electronic device 102a to help cool the electronic device 102a. In some examples, the fan 142 can force air through the first cover side 130a of the protective case 128a to help cool the portion of the first cover side 130a that is near or in contact with the first side 116 of the chassis 114 that is close to or in contact with the flexible vapor chamber 110a. The fan 142 can be an expandable fan that has a flat profile when the electronic device 102a is on or directly over the fan 142 and extends out away from the first cover side 130a when the electronic device 102a is not on or not directly over the fan 142 (e.g., as illustrated in FIG. 4). The second cover side 132a can include a user input area 138. In a specific example, the user input area 138 can be a keyboard. The user input area 138 can be in communication with the electronic device (e.g., wired or wirelessly) to allow the user to input data (e.g., keystrokes, curser movement, etc.) into the electronic device 102a.

Figure 5A:
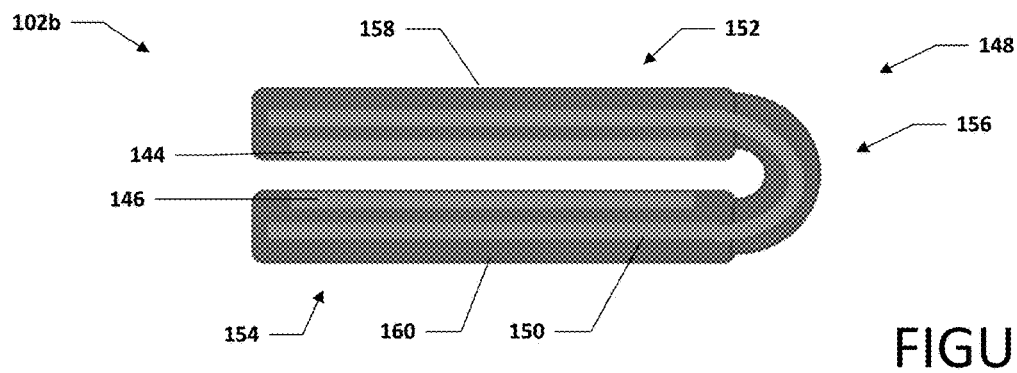
FIGS. 5A-5C are a simplified diagram of a partial cut away side view of a system to enable a flexible vapor chamber with shape memory material, in accordance with an embodiment of the present disclosure.
Figure 5B:
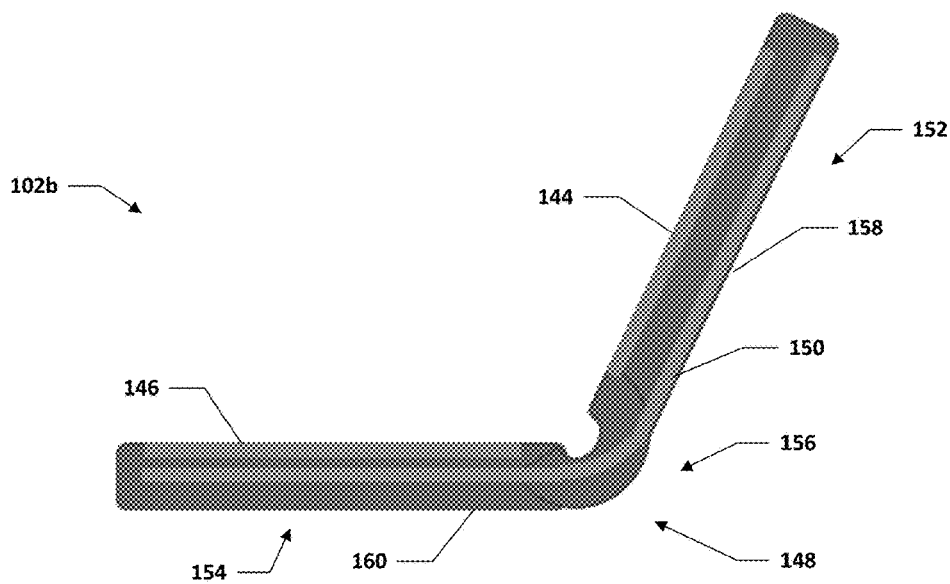
Figure 5C:
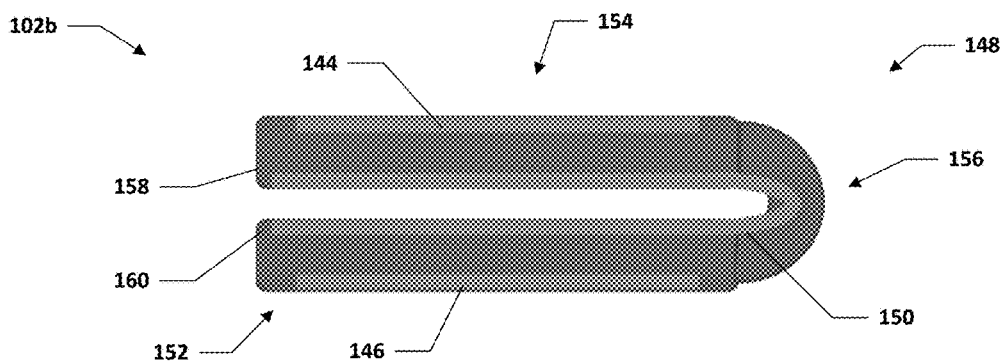

Turning to FIGS. 5A-5C, FIGS. 5A-5C are simple block diagrams illustrating example details of a portion of a system configured to include a flexible vapor chamber with shape memory material, in accordance with an embodiment of the present disclosure. In an example, an electronic device 102b can include a first display 144, a second display 146, a foldable chassis 148, and a flexible vapor chamber comprised of shape memory material 150. In an example, the flexible vapor chamber comprised of shape memory material 150 includes a flexible vapor chamber where at least a portion of the flexible vapor chamber is made of shape memory material. In another example, the flexible vapor chamber comprised of shape memory material 150 can be a flexible vapor chamber that includes embedded shape memory material. In yet another example, the flexible vapor chamber comprised of shape memory material 150 includes one or more strips of shape memory material on a flexible vapor chamber. In some examples, the flexible vapor chamber comprised of shape memory material 150 is a flexible heat pipe, flexible cold plate, flexible heat spreader (graphic heat spreader, etc.) or some other flexible thermo conductive material or element that includes shape memory material or is coupled to shape memory material.

The foldable chassis 148 can include a first portion chassis 152, a second portion chassis 154, and a hinge 156. The first portion chassis 152 can include a first portion opposite display surface 158. The first portion opposite display surface 158 is the surface of the first portion chassis 152 that is opposite of the first display 144. The second portion chassis 154 can include a second portion opposite display surface 160. The second portion opposite display surface 160 is the surface of the second portion chassis 154 that is opposite of the second display 146. As illustrated in FIGS. 5A-5C, the flexible vapor chamber comprised of shape memory material 150 can extend through the hinge 156 and the hinge 156 can accommodate deformations in the flexible vapor chamber comprised of shape memory material 150 as the electronic device 120b is bent. In other examples, the flexible vapor chamber comprised of shape memory material 150 does not extend through the hinge 156.

The flexible vapor chamber comprised of shape memory material 150 can collect heat from one or more heat sources (not shown) in the electronic device 102b to help cool the one or more heat sources. When the electronic device 102b is in a closed configuration, as illustrated in FIG. 5A, the first display 144 is facing the second display 146 and the first portion opposite display surface 158 of the first portion chassis 152 and the second portion opposite display surface 160 of the second portion chassis 154 are exposed and susceptible to being touched by a user. If heat from the flexible vapor chamber comprised of shape memory material 150 were to be transferred to the first portion opposite display surface 158 of the first portion chassis 152 and the second portion opposite display surface 160 of the second portion chassis 154, the surfaces could become relatively hot and unsafe because they could burn, harm, or hurt the user if the user touched the surfaces. Hence, when the electronic device 102b is in a closed configuration, as illustrated in FIG. 5A, the flexible vapor chamber comprised of shape memory material 150 is not activated and the flexible vapor chamber comprised of shape memory material 150 is located away from the first portion opposite display surface 158 and away from the second portion opposite display surface 160.

When the electronic device 102b is in an open configuration, as illustrated in FIG. 5B, the first display 144 is rotated or pivoted away from the second display 146. The second portion opposite display surface 160 of the second portion chassis 154 may be on a surface such as a table or lap of the user. If heat from the flexible vapor chamber comprised of shape memory material 150 were to be transferred to the second portion opposite display surface 160 of the second portion chassis 154, the second portion opposite display surface 160 could become relatively hot and unsafe because it could burn, harm, or hurt the surface on which the electronic devices is resting or the lap of the user if the electronic devices is in the user's lap. Hence, when the electronic device 102b is in an open configuration, as illustrated in FIG. 5B, the portion of the flexible vapor chamber comprised of shape memory material 150 that is near the second portion opposite display surface 160 of the second portion chassis 154 is not activated and the flexible vapor chamber comprised of shape memory material 150 is located away from the second portion opposite display surface 160.

Also, when the electronic device 102b is in an open configuration, as illustrated in FIG. 5B, the first portion opposite display surface 158 of the first portion chassis 152 is exposed to the environment. However, the risk of the user touching the first portion opposite display surface 158 of the first portion chassis 152 while the electronic device is in the open configuration illustrated in FIG. 5B is relatively small and extra cooling can be achieved by the first portion opposite display surface 158 of the first portion chassis 152 being exposed to the environment. Hence, when the electronic device 102b is in an open configuration, as illustrated in FIG. 5B, the portion of the flexible vapor chamber comprised of shape memory material 150 that is near the first portion opposite display surface 158 of the first portion chassis 152 is activated and the flexible vapor chamber comprised of shape memory material 150 is located near the first portion opposite display surface 158 to transfer heat to the first portion opposite display surface 158 of the first portion chassis 152 where it can be dissipated to the environment around the electronic device 102b.

When the electronic device 102b is in an open tablet configuration, as illustrated in FIG. 5C, the first display 144 is facing opposite the second display 146 and the first portion opposite display surface 158 of the first portion chassis 152 and the second portion opposite display surface 160 of the second portion chassis 154 are facing each other and are not exposed and are not susceptible to being touched by a user. Hence, when the electronic device 102b is in the open tablet configuration, as illustrated in FIG. 5C, the flexible vapor chamber comprised of shape memory material 150 is activated and the flexible vapor chamber comprised of shape memory material 150 is located on or close to the first portion opposite display surface 158 of the first portion chassis 152 and the second portion opposite display surface 160 to transfer heat to the first portion chassis 152 and the second portion opposite display surface 160.

Figure 6A:
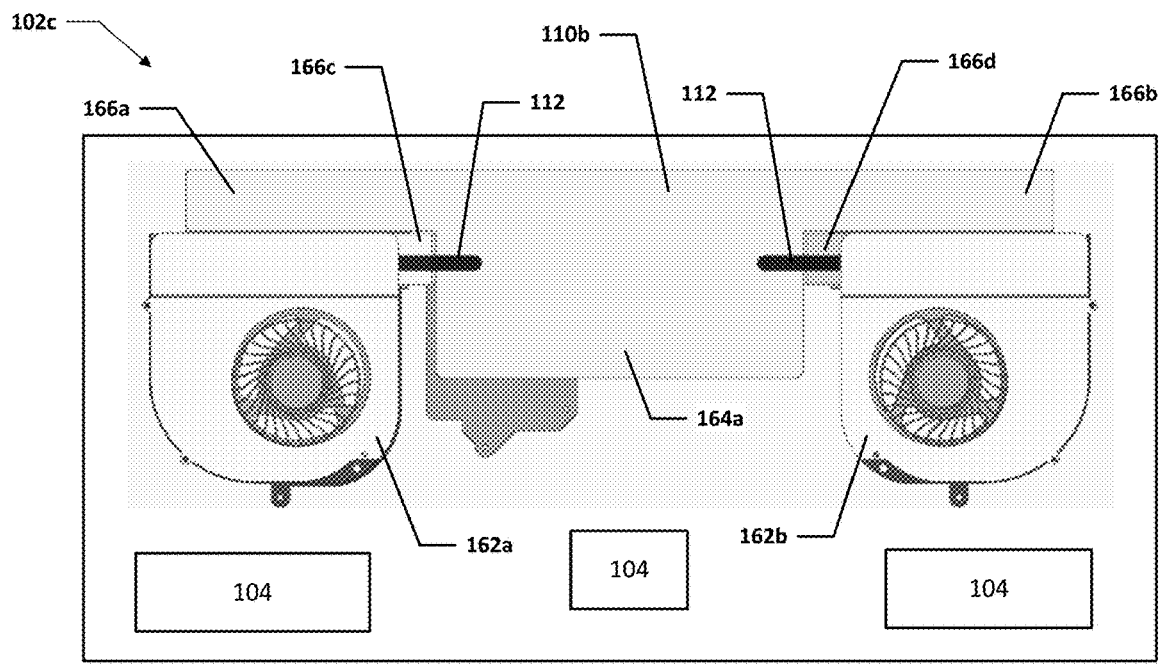
FIG. 6A is a simplified diagram of a partial cut away top view of a system to enable a flexible vapor chamber with shape memory material, in accordance with an embodiment of the present disclosure.
Figure 6B:
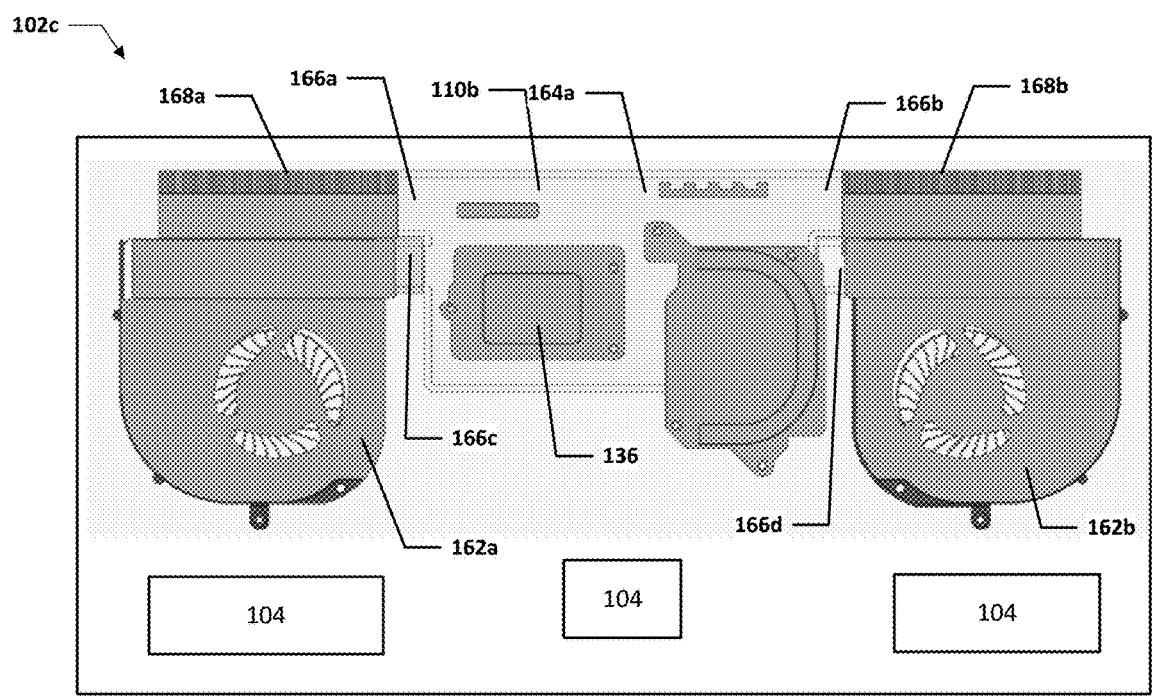
FIG. 6B is a simplified diagram of a partial cut away bottom view of a system to enable a flexible vapor chamber with shape memory material, in accordance with an embodiment of the present disclosure.

Turning to FIGS. 6A and 6B, FIGS. 6A and 6B are simple block diagrams illustrating example details of a portion of a system configured to include a flexible vapor chamber with shape memory material, in accordance with an embodiment of the present disclosure. In an example, an electronic device 102c can include one or more electronic components 104, one or more heat sources 106 (not shown) coupled to one or more heat source interfaces 136 (illustrated in FIG. 6B), a flexible vapor chamber 110b, shape memory material 112, a first air mover 162a, a second air mover 162b, a first heat exchanger 168a, and a second heat exchanger 168b. The flexible vapor chamber 110b can include a main body 164a and one or more extensions 166 that extend from the main body 164a. For example, as illustrated in FIGS. 6A and 6B, extensions 116a-116d extend from the main body 164a. The first air mover 162a and the second air mover 162b can be fans. The first heat exchanger 168a and the second heat exchanger 168b can be fins.

In an example, the shape memory material 112 can be over or on one or more of the extensions 166 that extend from the main body 164a of the flexible vapor chamber 110b. For example, as illustrated in FIG. 6A, the shape memory material 112 is over or on the extensions 166c and 166d. When the shape memory material 112 is not activated, the extensions 116a-166d can be relatively on the same plane.

Figure 7A:
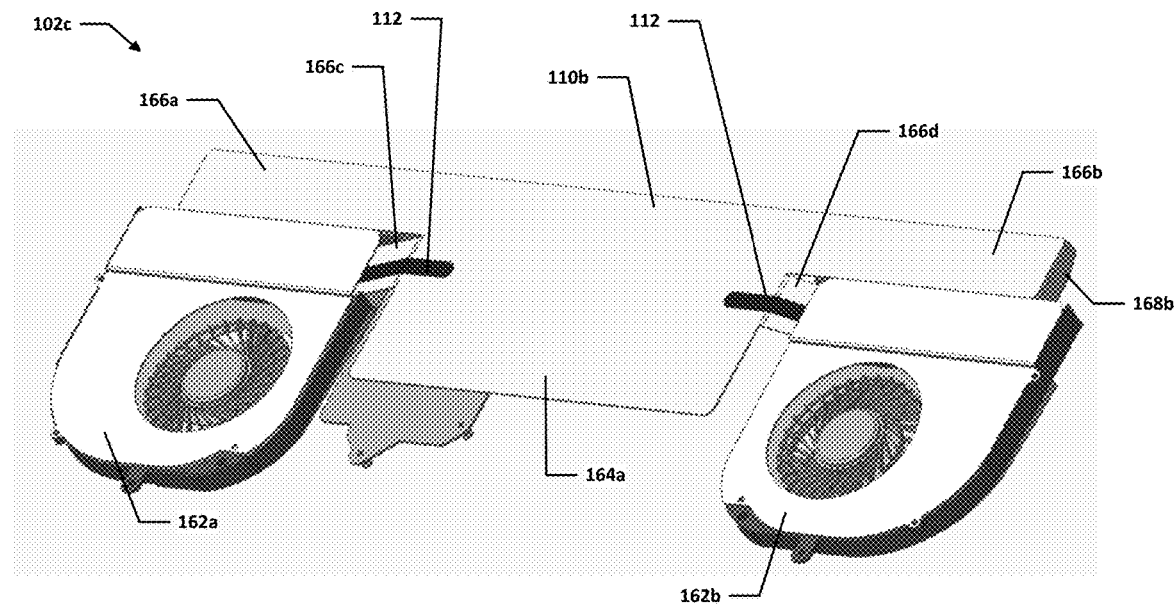
FIG. 7A is a simplified diagram of a partial cut away top perspective view of a system to enable a flexible vapor chamber with shape memory material, in accordance with an embodiment of the present disclosure.
Figure 7B:
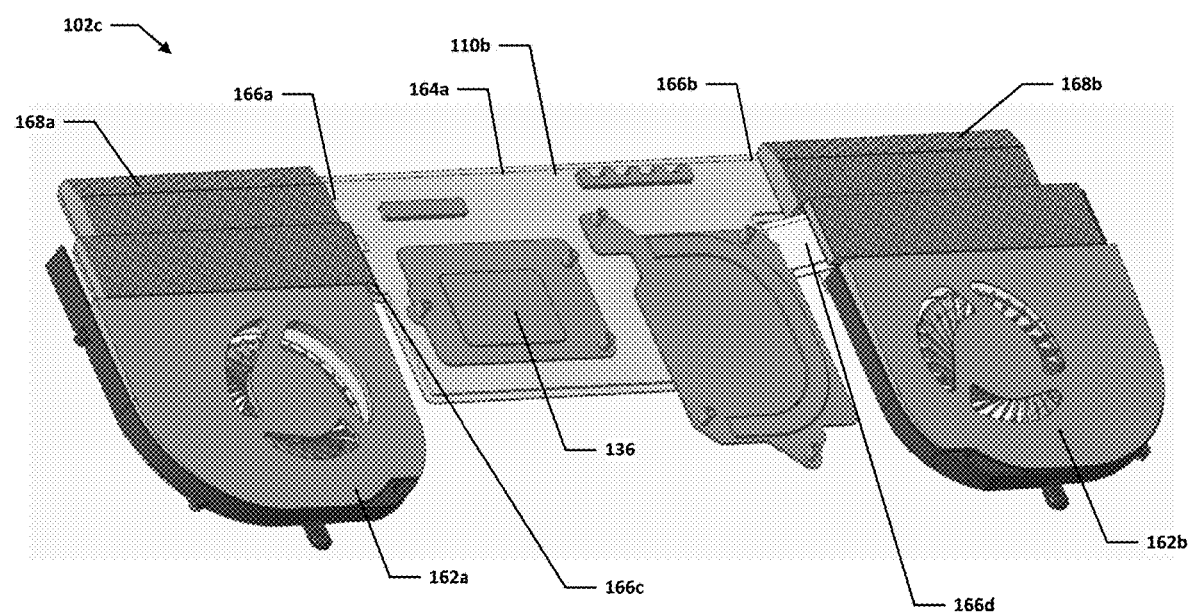
FIG. 7B is a simplified diagram of a partial cut away bottom perspective view of a system to enable a flexible vapor chamber with shape memory material, in accordance with an embodiment of the present disclosure.

Turning to FIGS. 7A and 7B, FIGS. 7A and 7B are simple block diagrams illustrating example details of a portion of a system configured to include a flexible vapor chamber with shape memory material, in accordance with an embodiment of the present disclosure. In an example, the electronic device 102c can include one or more electronic components 104, one or more heat source interfaces 136 (illustrated in FIG. 7B), the flexible vapor chamber 110b, shape memory material 112, the first air mover 162a, the second air mover 162b, the first heat exchanger 168a, and the second heat exchanger 168b. The flexible vapor chamber 110b can include the main body 164a and one or more extensions 166 that extend from the main body 164a. For example, as illustrated in FIGS. 7A and 7B, the extensions 116a-116d extend from the main body 164a. The first air mover 162a and the second air mover 162b can be fans. The first heat exchanger 168a and the second heat exchanger 168b can be fins.

In an example, the shape memory material 112 can be over or on one or more of the extensions 166 that extend from the main body 164a of the flexible vapor chamber 110b. For example, as illustrated in FIG. 7A, the shape memory material 112 is over or on the extensions 166c and 166d. When the shape memory material 112 is activated, the extensions 166c and 166d move so the extensions 116a and 116b are not on relatively the same plane as the extensions 116c and 116d. Because the extensions 116a and 116b are not on relatively the same plane as the extensions 116c and 116d, the heat exchangers can be staggered (e.g., as illustrated in FIG. 8B) for a lower air flow resistance path of air from the first air mover 162a and the second air mover 162b. This can increase the cooling capability of the electronic device 102c when increased cooling is needed. In some examples, the electronic device 102c can include an expandable heatsink and/or fan to further help increase the airflow without increasing the system Z-height when increased cooling is not needed.

Figure 8A:
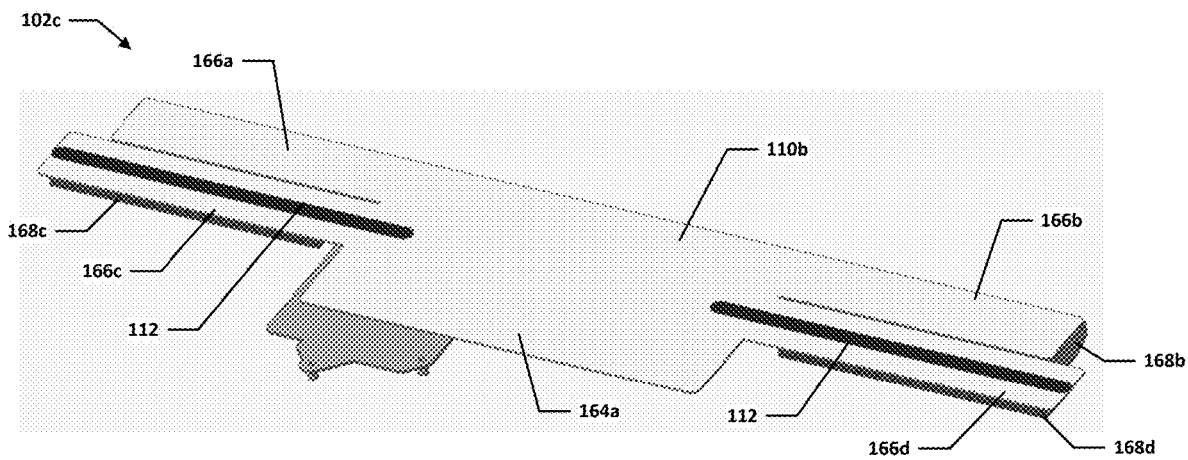
FIGS. 8A and 8B are a simplified diagram of a partial cut away perspective view of a system to enable a flexible vapor chamber with shape memory material, in accordance with an embodiment of the present disclosure.
Figure 8B:
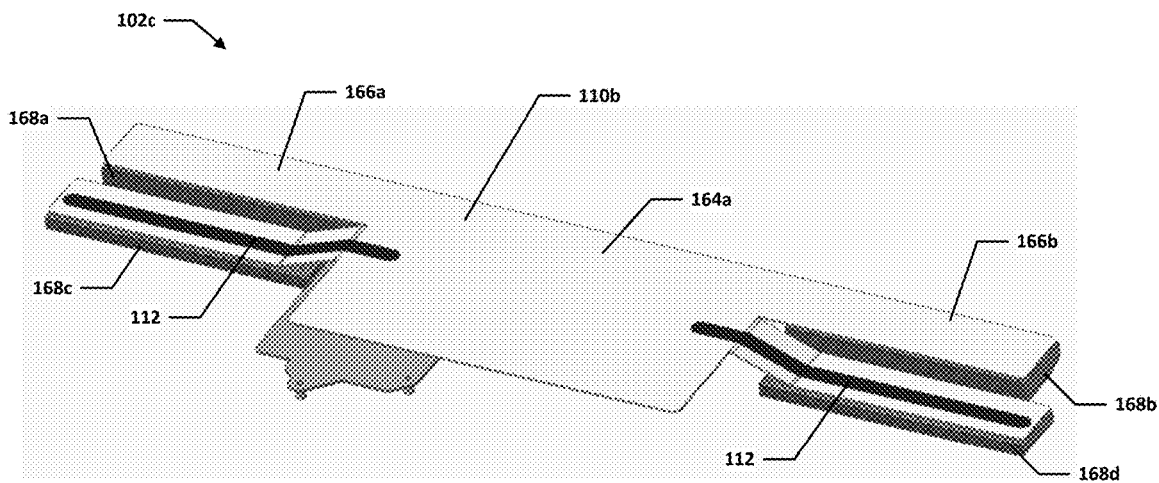

Turning to FIG. 8A, FIG. 8A is a simple block diagram illustrating example details of a portion of a system configured to include a flexible vapor chamber with shape memory material, in accordance with an embodiment of the present disclosure. In an example, the electronic device 102c can include the flexible vapor chamber 110b, the shape memory material 112, and one or more heat exchangers 168. For example, as illustrated in FIG. 8A, the electronic device 102c can include heat exchangers 168a-168d (the heat exchanger 168a is not shown). The flexible vapor chamber 110b can include the main body 164a and one or more extensions 166 that extend from the main body 164a. For example, as illustrated in FIG. 8A, the extensions 116a-116d extend from the main body 164a. The shape memory material 112 can be over or on one or more of the extensions 166 that extend from the main body 164a of the flexible vapor chamber 110b. For example, as illustrated in FIG. 8A, the shape memory material 112 is over or on the extensions 166c and 166d. The heat exchangers 168 can be coupled to the extensions 166 of the flexible vapor chamber 110b. For example, as illustrated in FIG. 8A, the heat exchanger 168a (not shown) can be under the extension 166a, the heat exchanger 168b can be under the extension 166b, the heat exchanger 168c can be under the extension 166c, and the heat exchanger 168d can be under the extension 166d. When the shape memory material 112 is not activated, the extensions 166a-166d and the heat exchangers 168a-168d can be on relatively the same plane.

Turning to FIG. 8B, FIG. 8B is a simple block diagram illustrating example details of a portion of a system configured to include a flexible vapor chamber with shape memory material, in accordance with an embodiment of the present disclosure. In an example, the electronic device 102c can include the flexible vapor chamber 110b, the shape memory material 112, and the one or more heat exchangers 168. For example, as illustrated in FIG. 8B, the electronic device 102c can include the heat exchangers 168a-168d. The flexible vapor chamber 110b can include the main body 164a and one or more extensions 166 that extend from the main body 164a. For example, as illustrated in FIG. 8B, the extensions 166a-166d extend from the main body 164a. The shape memory material 112 can be over or on one or more of the extensions 166 that extend from the main body 164a of the flexible vapor chamber 110b. For example, as illustrated in FIG. 8B, the shape memory material 112 is over or on the extensions 166c and 166d. The heat exchangers 168 can be coupled to the extensions 166 of the flexible vapor chamber 110b. For example, as illustrated in FIG. 8B, the heat exchanger 168a can be under the extension 166a, the heat exchanger 168b can be under the extension 166b, the heat exchanger 168c can be under the extension 166c, and the heat exchanger 168d can be under the extension 166d. When the shape memory material 112 is activated, the extensions 166c and 166d are moved so the extensions 166a and 166b are not on relatively the same plane as the extensions 116c and 116d. Because the extensions 166a and 166b are not on relatively the same plane as the extensions 166c and 166d, the heat exchangers 168a-168d can be staggered for a lower air flow resistance path (e.g., from the first air mover 162a and the second air mover 162b illustrated in FIGS. 6A-7B). This can increase the cooling capability of the electronic device 102c when increased cooling is needed. In some examples, the electronic device 102c can include an expandable heatsink and/or fan to further help increase the airflow without increasing the system Z-height when increased cooling is not needed.

Figure 9:
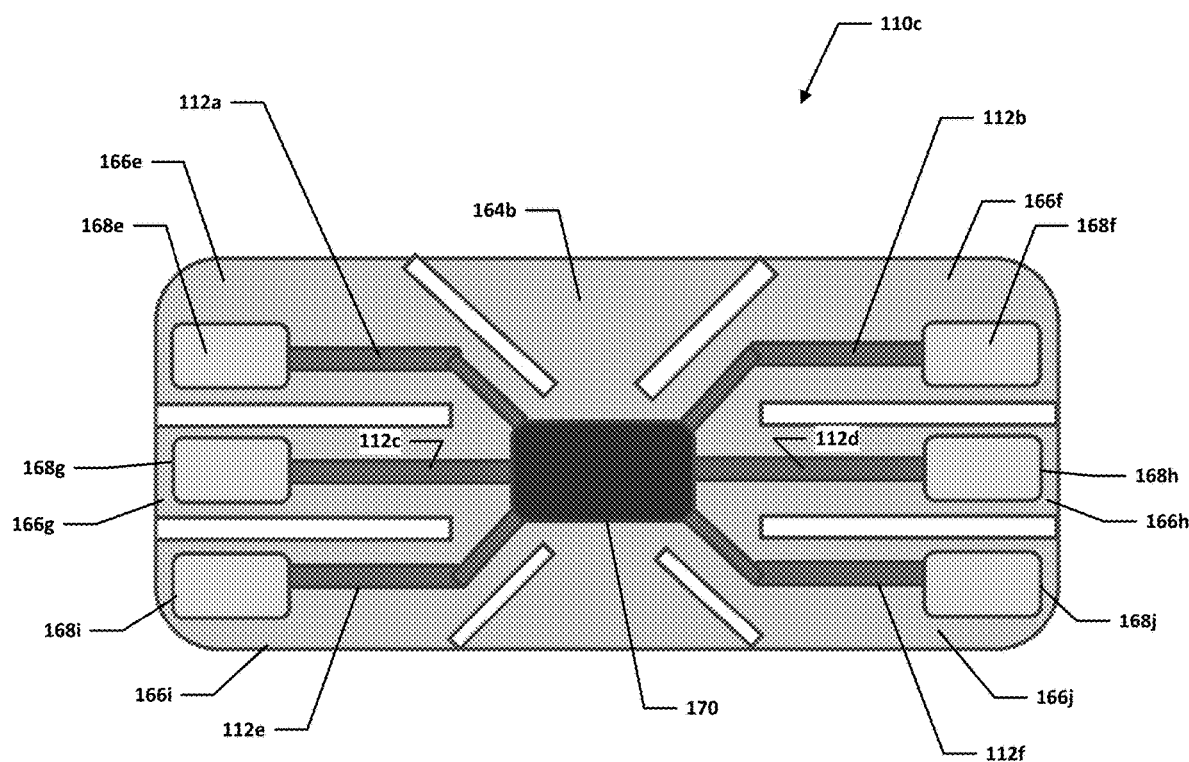
FIG. 9 are a simplified diagram of a partial cut away view of a system to enable a flexible vapor chamber with shape memory material, in accordance with an embodiment of the present disclosure.

Turning to FIG. 9, FIG. 9 is a simple block diagram illustrating example details of a portion of a system configured to include a flexible vapor chamber with shape memory material, in accordance with an embodiment of the present disclosure. In an example, a flexible vapor chamber 110c can include a main body 164b and a plurality of extensions 166 that extend from the main body 164b. For example, as illustrated in FIG. 9, extensions 166e-166j extend from the main body 164b. One or more of the plurality of extensions 166 can include shape memory material 112 and/or a heat exchanger 168. For example, as illustrated in FIG. 9, the extension 166e includes shape memory material 112a and a heat exchanger 168e, the extension 166f includes shape memory material 112b and a heat exchanger 168f, the extension 166g includes shape memory material 112c and a heat exchanger 168g, the extension 166h includes shape memory material 112d and a heat exchanger 168h, the extension 166i includes shape memory material 112e and a heat exchanger 168i, and the extension 166j includes shape memory material 112f and a heat exchanger 168j. While FIG. 9 illustrates each extension 166 including shape memory material 112 and the heat exchanger 168, one or more of the plurality of extensions 166 may not include the shape memory material 112 and/or the heat exchanger 168, depending on design choice and design constraints. Also, while six (6) extensions 166 are illustrated, the flexible vapor chamber 110c can include more or less extensions 166, depending on design choice and design constraints. In some examples, the shape memory material activator 170 may be used to activate and deactivate one or more of the shape memory material 112a-112f. Each of the shape memory material 112a-112f can be activated to help increase the cooling capacity of the flexible vapor chamber 110c. For example, one or more of the shape memory material 112a-112f can be activated to move one or more of the extensions 116e-116j and heat exchangers 168e-168j out of plane of the other heat exchangers 1168 to allow for increased air flow through the heat exchangers 168e-168j. In another example, one or more of the shape memory material 112a-112f can be activated to move one or more of the extensions 116e-116j and heat exchangers 168e-168j onto a specific heat source and/or off of other heat sources to help provide additional cooling of the specific heat source.

Figure 10:
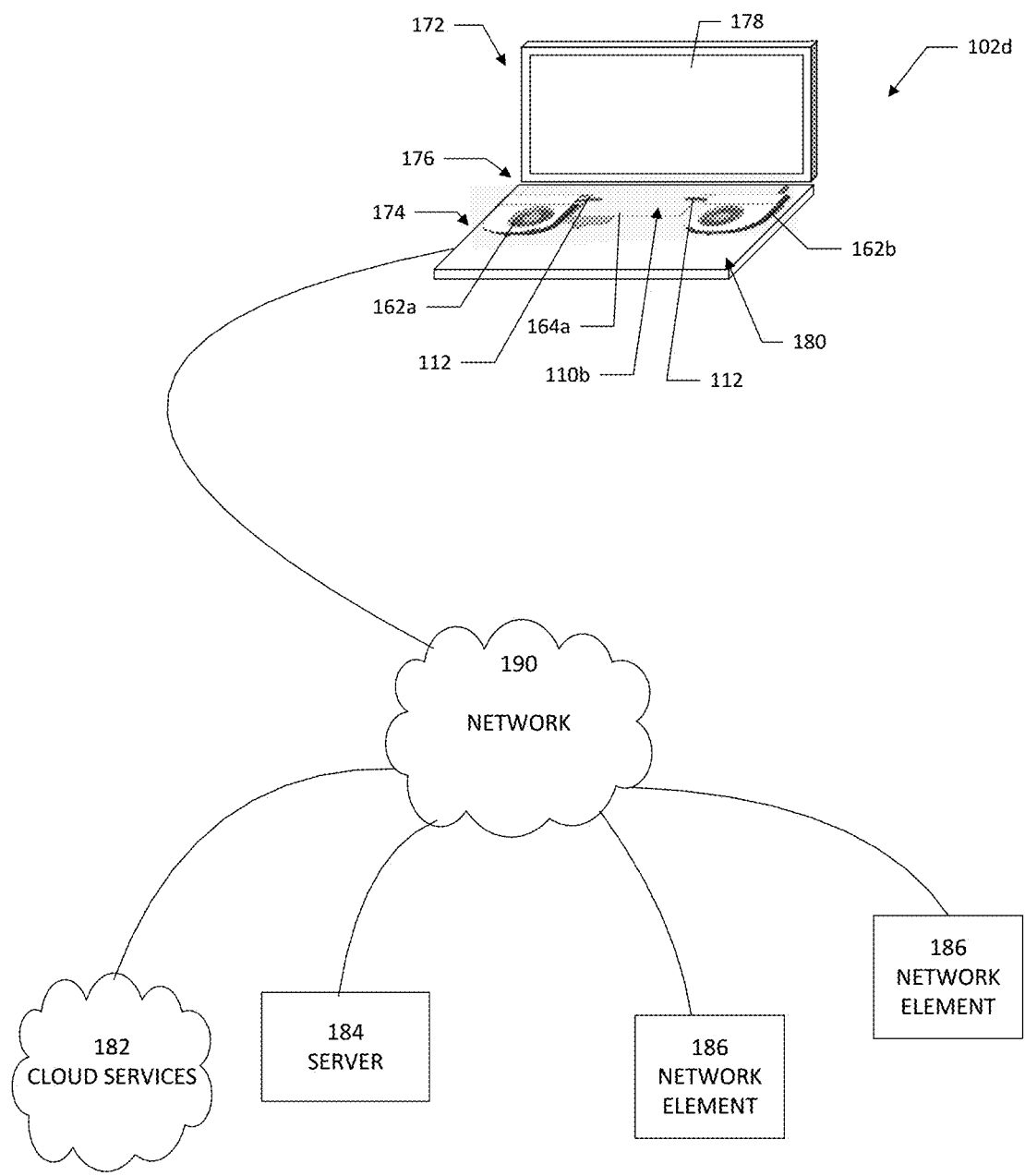
FIG. 10 is a simplified diagram simplified block diagram of a system that includes a flexible vapor chamber with shape memory material, in accordance with an embodiment of the present disclosure.

Turning to FIG. 10, FIG. 10 is a simplified block diagram of an electronic device 100d configured to include a flexible vapor chamber with shape memory material. In an example, the electronic device 102d can include a first housing 172 and a second housing 174. The first housing 172 can be rotatably or pivotably connected to the second housing 174 using a hinge 176. The first housing 172 can include a display 178. The second housing can include one or more heat sources (e.g., one or more heat sources 106, not shown), the flexible vapor chamber 110b, the shape memory material 112, the first air mover 162a, and the second air mover 162b. In an example, the shape memory material 112 can be over or on one or more extensions 166 (not referenced) that extend from the main body 164a of the flexible vapor chamber 110b.

When the shape memory material 112 is not activated, the extensions 166 that extend from the main body 164a of the flexible vapor chamber 110b can be relatively on the same plane. When the shape memory material 112 is activated, the extensions 166 that extend from the main body 164a of the flexible vapor chamber 110b are moved so the extensions 166 are not all on relatively the same plane. Because all the extensions are not on relatively the same plane, heat exchangers coupled to the extensions 166 can be staggered (e.g., as illustrated in FIG. 8B) for a lower air flow resistance path from the first air mover 162a and the second air mover 162b. This can increase the cooling capability of the electronic device 102d when increased cooling is needed. In some examples, the electronic device 102d can include an expandable heatsink and/or fan to further help increase the airflow (e.g., an expandable heatsink as disclosed in U.S. patent application Ser. No. 16/914,096 titled EXPANDABLE HEAT SINK, incorporated by reference). Electronic device 100d (and electronic devices 102a-102c) may be in communication with cloud services 182, a server 184 and/or one or more network elements 186 using a network 190. In other examples, electronic device 102d (and electronic devices 102a-102c) may be a standalone device and not in communication with the network 190.

The network 190 represents a series of points or nodes of interconnected communication paths for receiving and transmitting packets of information. The network 190 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 190, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, the electronic devices 102a-102d are meant to encompass a computer, a personal digital assistant (PDA), a laptop or electronic notebook, hand held device, a cellular telephone, a smartphone, an IP phone, wearables, network elements, network appliances, servers, routers, switches, gateways, bridges, load balancers, processors, modules, or any other device, component, element, or object that includes a heat source and can allow for a flexible vapor chamber with shape memory material. Each of electronic devices 102a-102d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of the electronic devices 102a-102d may include virtual elements.

In regards to the internal structure, each of the electronic devices 102a-102d can include memory elements for storing information to be used in operations. Each of the electronic devices 102a-102d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

In an example implementation, elements of the electronic devices 102a-102d may include software modules (e.g., the shape memory material activator 170, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, each of the electronic devices 102a-102d can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

It is also important to note that the preceding diagrams illustrate only some of the possible scenarios and patterns that may be executed by, or within, the electronic devices 102a-102d. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. Substantial flexibility is provided by the electronic devices 102a-102d in that any suitable arrangements, chronologies, configurations, and timing mechanisms may be provided without departing from the teachings of the present disclosure.

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that the electronic devices 102a-102d and their teachings are readily scalable and can accommodate a large number of components, as well as more complicated/sophisticated arrangements and configurations. Accordingly, the examples provided should not limit the scope or inhibit the broad teachings of the electronic devices 102a-102d and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the electronic devices 102a-102d have been illustrated with reference to particular elements and operations, these elements and operations may be replaced by any suitable architecture, protocols, and/or processes that achieve the intended functionality of the electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device includes one or more heat sources, a flexible vapor chamber over the one or more heat sources, shape memory material, wherein when the shape memory material is activated, the shape memory material moves a portion of the flexible vapor chamber to a position that helps with heat dissipation of heat collected by the flexible vapor chamber, and an activator, wherein the activator activates the shape memory material.

In Example A2, the subject matter of Example A1 can optionally include a chassis, wherein when the shape memory material is activated, the shape memory material moves the portion of the flexible vapor chamber to a location that is on or approximately on the chassis to help dissipate heat collected by the flexible vapor chamber to the chassis.

In Example A3, the subject matter of Example A2 can optionally include a proximity sensor, wherein the shape memory material is activated when the proximity sensor detects a cover over the chassis.

In Example A4, the subject matter of Example A3 can optionally include where the cover is a cooling docking station.

In Example A5, the subject matter of Example A4 can optionally include where the cooling docking station includes a fan.

In Example A6, the subject matter of Example A1 can optionally include where the flexible vapor chamber includes a main body and one or more extensions that extend from the main body.

In Example A7, the subject matter of Example A1 can optionally include a plurality of heat exchangers, wherein at least a portion of the one or more extensions are coupled to a heat exchanger from the plurality of heat exchangers.

In Example A8, the subject matter of Example A1 can optionally include where when the shape memory material is activated, the flexible vapor chamber moves one or more of the extensions to a location that is out of plane with other extensions to help increase airflow through the plurality of heat exchangers and help dissipate heat collected by the flexible vapor chamber.

In Example A9, the subject matter of any of Examples A1-A2 can optionally include a proximity sensor, wherein the shape memory material is activated when the proximity sensor detects a cover over the chassis.

In Example A10, the subject matter of any of Examples A1-A3 can optionally include where the cover is a cooling docking station.

In Example A11, the subject matter of any of Examples A1-A4 can optionally include where the cooling docking station includes a fan.

In Example A12, the subject matter of any of Examples A1-A5 can optionally include where the flexible vapor chamber includes a main body and one or more extensions that extend from the main body.

In Example A13, the subject matter of any of Examples A1-A6 can optionally include a plurality of heat exchangers, wherein at least a portion of the one or more extensions are coupled to a heat exchanger from the plurality of heat exchangers.

In Example A14, the subject matter of any of Examples A1-A7 can optionally include where when the shape memory material is activated, the flexible vapor chamber moves one or more of the extensions to a location that is out of plane with other extensions to help increase airflow through the plurality of heat exchangers and help dissipate heat collected by the flexible vapor chamber.

Example AA1 is a flexible vapor chamber with shape memory material including a flexible vapor chamber and shape memory material, wherein when the shape memory material is activated, the shape memory material moves a portion of the flexible vapor chamber.

In Example AA2, the subject matter of Example AA1 can optionally include where the shape memory material moves the portion of the flexible vapor chamber to a location that is on or approximately on a chassis of an electronic device that includes the flexible vapor chamber with shape memory material to help dissipate heat collected by the flexible vapor chamber to the chassis of the electronic device.

In Example AA3, the subject matter of Example AA2 can optionally include where the shape memory material is activated when a proximity sensor detects a cover over the chassis of the electronic device.

In Example AA4, the subject matter of Example AA1 can optionally include where the flexible vapor chamber includes a main body and one or more extensions that extend from the main body.

In Example AA5, the subject matter of Example AA4 can optionally where the shape memory material is coupled to at least a portion of the one or more of the extensions.

In Example AA6, the subject matter of Example AA4 can optionally include where at least a portion of the one or more of the extensions are coupled to a heat exchanger.

In Example AA7, the subject matter of Example AA6 can optionally include where when the shape memory material is activated, one or more of the extensions are moved out of plane with other extensions to help increase airflow through each heat exchanger coupled to the one or more extensions to help dissipate heat collected by the flexible vapor chamber.

In Example AA8, the subject matter of any of the Examples AA1-AA2 can optionally include where the shape memory material is activated when a proximity sensor detects a cover over the chassis of the electronic device.

In Example AA9, the subject matter of any of the Examples AA1-AA3 can optionally include where the flexible vapor chamber includes a main body and one or more extensions that extend from the main body.

In Example AA10, the subject matter of any of the Examples AA1-AA4 can optionally where the shape memory material is coupled to at least a portion of the one or more of the extensions.

In Example AA11, the subject matter of any of the Examples AA1-AA5 can optionally include where at least a portion of the one or more of the extensions are coupled to a heat exchanger.

In Example AA12, the subject matter of any of the Examples AA1-AA6 can optionally include where when the shape memory material is activated, one or more of the extensions are moved out of plane with other extensions to help increase airflow through each heat exchanger coupled to the one or more extensions to help dissipate heat collected by the flexible vapor chamber.

Example M1 is a method for increasing a cooling capacity of a flexible vapor chamber in an electronic device, the method including determining that the cooling capacity of the flexible vapor chamber can be increased and activating shape memory material to move a portion of the flexible vapor chamber to a position that helps with heat dissipation of heat collected by the flexible vapor chamber.

In Example M2, the subject matter of Example M1 can optionally include where when the shape memory material is activated, the portion of the flexible vapor chamber moves to a location that is on or approximately on a chassis of the electronic device to help dissipate heat collected by the flexible vapor chamber to the chassis of the electronic device.

In Example M3, the subject matter of Example M2 can optionally include where the shape memory material is activated when a proximity sensor detects a cover over the chassis of the electronic device.

In Example M4, the subject matter of Example M3 can optionally include where the cover includes an active heat sink or a passive heat sink.

In Example M5, the subject matter of Example M1 can optionally include where the flexible vapor chamber includes a main body and a plurality of extension that extend from the main body, wherein when the shape memory material is activated, the shape memory material moves one or more of the extensions to a location that is out of plane with other extensions to help increase airflow through one or more heat exchangers and help dissipate heat collected by the flexible vapor chamber.

In Example M6, the subject matter of any of the Examples M1-M2 can optionally include where the shape memory material is activated when a proximity sensor detects a cover over the chassis of the electronic device.

In Example M7, the subject matter of any of the Examples M1-M3 can optionally include where the cover includes an active heat sink or a passive heat sink.

In Example M8, the subject matter of any of the Examples M1-M4 can optionally include where the flexible vapor chamber includes a main body and a plurality of extension that extend from the main body, wherein when the shape memory material is activated, the shape memory material moves one or more of the extensions to a location that is out of plane with other extensions to help increase airflow through one or more heat exchangers and help dissipate heat collected by the flexible vapor chamber.

What is claimed is:

1. An electronic device comprising:
   one or more heat sources;
   a flexible vapor chamber in thermal proximity to the one or more heat sources;
   shape memory material;
   a chassis, wherein when the shape memory material is activated, the shape memory material moves a portion of the flexible vapor chamber to a location that is on or approximately on the chassis to help dissipate heat from the one or more heat sources collected by the flexible vapor chamber to the chassis; and
   an activator, wherein the activator activates the shape memory material.

2. The electronic device of claim 1, further comprising:
   a proximity sensor, wherein the shape memory material is activated when the proximity sensor detects a cover over the chassis.

3. The electronic device of claim 2, wherein the cover is a cooling docking station.

4. The electronic device of claim 3, wherein the cooling docking station includes a fan.

5. The electronic device of claim 1, wherein the flexible vapor chamber includes:
   a main body; and
   one or more extensions that extend from the main body.

6. The electronic device of claim 5, further comprising:
   a plurality of heat exchangers, wherein at least a portion of the one or more extensions are coupled to a heat exchanger from the plurality of heat exchangers.

7. The electronic device of claim 6, wherein when the shape memory material is activated, the flexible vapor chamber moves one or more of the extensions to a location that is out of plane with other extensions to help increase airflow through the plurality of heat exchangers and help dissipate heat collected by the flexible vapor chamber.

8. A flexible vapor chamber with shape memory material comprising:
   the flexible vapor chamber; and
   shape memory material, wherein when the shape memory material is activated, the shape memory material moves a portion of the flexible vapor chamber to a location that is on or approximately on a chassis of an electronic device that includes the flexible vapor chamber to help dissipate heat from one or more heat sources collected by the flexible vapor chamber to the chassis.

9. The flexible vapor chamber with shape memory material of claim 8, wherein the shape memory material is activated when a proximity sensor detects a cover over the chassis of the electronic device.

10. The flexible vapor chamber with shape memory material of claim 8, wherein the flexible vapor chamber includes:
    a main body; and
    one or more extensions that extend from the main body.

11. The flexible vapor chamber with shape memory material of claim 10, wherein the shape memory material is coupled to at least a portion of the one or more of the extensions.

12. The flexible vapor chamber with shape memory material of claim 10, wherein at least a portion of the one or more of the extensions are coupled to a heat exchanger.

13. The flexible vapor chamber with shape memory material of claim 12, wherein when the shape memory material is activated, one or more of the extensions are moved out of plane with other extensions to help increase airflow through each heat exchanger coupled to the one or more extensions to help dissipate heat collected by the flexible vapor chamber.

14. A method for increasing a cooling capacity of a flexible vapor chamber over one or more heat sources in an electronic device, the method comprising:
    determining that the cooling capacity of the flexible vapor chamber over the one or more heat sources can be increased; and
    activating shape memory material to move a portion of the flexible vapor chamber to a position that helps with heat dissipation of heat collected by the flexible vapor chamber, wherein when the shape memory material is activated, the shape memory material moves a portion of the flexible vapor chamber from a first position to a second position that is on or approximately on a chassis of the electronic device to help dissipate heat collected by the flexible vapor chamber to the chassis, wherein the second position dissipates more heat collected by the flexible vapor chamber than the first position.

15. The method of claim 14, wherein the shape memory material is activated when a proximity sensor detects a cover over the chassis of the electronic device.

16. The method of claim 15, wherein the cover includes an active heat sink or a passive heat sink.

17. The method of claim 14, wherein the flexible vapor chamber includes a main body and a plurality of extension that extend from the main body, wherein when the shape memory material is activated, the shape memory material moves one or more of the extensions to a location that is out of plane with other extensions to help increase airflow through one or more heat exchangers and help dissipate heat collected by the flexible vapor chamber.

* * * * *